US011525865B2

(12) United States Patent
Hinterberger et al.

(10) Patent No.: US 11,525,865 B2
(45) Date of Patent: Dec. 13, 2022

(54) ELECTRIC ENERGY SUPPLY SYSTEM HAVING AT LEAST ONE CELL ELEMENT AND MOTOR VEHICLE

(71) Applicant: AUDI AG, Ingolstadt (DE)

(72) Inventors: Michael Hinterberger, Großmehring (DE); Bernhard Liebhart, Ingolstadt (DE); Christian Endisch, Geisenfeld (DE)

(73) Assignee: AUDI AG, Ingolstadt (DE)

( * ) Notice: Subject to any disclaimer, the term of this patent is extended or adjusted under 35 U.S.C. 154(b) by 305 days.

(21) Appl. No.: 16/913,207

(22) Filed: Jun. 26, 2020

(65) Prior Publication Data

US 2020/0408843 A1 Dec. 31, 2020

(30) Foreign Application Priority Data

Jun. 28, 2019 (DE) ...................... 10 2019 209 468.6

(51) Int. Cl.
*H01M 10/48* (2006.01)
*G01R 31/389* (2019.01)
(Continued)

(52) U.S. Cl.
CPC ......... *G01R 31/389* (2019.01); *G01N 27/026* (2013.01); *G01R 31/392* (2019.01);
(Continued)

(58) Field of Classification Search
CPC .. G01N 27/026; G01N 27/404; G01R 31/389; G01R 31/392; H01M 10/48; H01M 2220/20; H01M 2250/20; H01M 8/04492; H01M 8/04552; H01M 8/04582; H01M 8/04664; H01M 8/04992; Y02E 60/10; Y02E 60/50; Y02T 10/70; Y02T 90/40
See application file for complete search history.

(56) References Cited

U.S. PATENT DOCUMENTS

2018/0003685 A1    1/2018 Cummings et al.

FOREIGN PATENT DOCUMENTS

| DE | 10 2013 218 077 A1 | 3/2015 |
|----|--------------------|--------|
| DE | 10 2013 218 081 A1 | 3/2015 |

(Continued)

OTHER PUBLICATIONS

Machine Translation DE102013218077A1 (Year: 2015).*

(Continued)

*Primary Examiner* — Victoria H Lynch
(74) *Attorney, Agent, or Firm* — Maier & Maier, PLLC

(57) ABSTRACT

An electric energy supply system having at least one cell element, which contains at least one galvanic cell, and having a measuring circuit, which is configured to ascertain at least one parameter of the at least one cell element by electrochemical impedance spectroscopy (EIS). The disclosure provides that the energy supply system comprises an electrochemical gas sensor and the gas sensor is connected to the measuring circuit via a toggle switch, wherein the measuring circuit is configured to apply an electric variable as the excitation variable in the gas sensor and to detect another electric variable as the measured variable at the gas sensor and to ascertain a gas concentration in the surroundings of the gas sensor.

20 Claims, 2 Drawing Sheets

(51) Int. Cl.
*H01M 8/04992* (2016.01)
*H01M 8/04492* (2016.01)
*H01M 8/04537* (2016.01)
*G01R 31/392* (2019.01)
*G01N 27/02* (2006.01)

(52) U.S. Cl.
CPC ... *H01M 8/04492* (2013.01); *H01M 8/04552* (2013.01); *H01M 8/04582* (2013.01); *H01M 8/04992* (2013.01); *H01M 10/48* (2013.01); *H01M 2220/20* (2013.01); *H01M 2250/20* (2013.01)

(56) References Cited

FOREIGN PATENT DOCUMENTS

| | | |
|---|---|---|
| DE | 10 2017 119 420 A1 | 3/2018 |
| DE | 10 2011 112 690 B4 | 7/2018 |
| DE | 10 2017 210 612 A1 | 12/2018 |

OTHER PUBLICATIONS

Examination Report dated May 15, 2020 in corresponding German application No. 10 2019 209 468.6; 12 pages including Machine-generated English-language translation.

* cited by examiner

ELECTRIC ENERGY SUPPLY SYSTEM HAVING AT LEAST ONE CELL ELEMENT AND MOTOR VEHICLE

FIELD

The disclosure relates to an electric energy supply system having at least one cell element. Such an energy supply system can be, for example, a high-voltage battery system or a fuel-cell system. A battery cell or a fuel cell can accordingly be respectively provided as a cell element. In general, each cell element contains at least one galvanic cell. The disclosure also includes a motor vehicle having the electric energy supply system.

BACKGROUND

Ascertaining the state of a battery system by means of an impedance measurement at the individual battery cells is known from DE 10 2017 119 420 A1. Each battery cell is simulated for this purpose by an equivalent circuit diagram or model and the parameters of the model are ascertained by means of a measurement of current and voltage. A predetermined frequency response is applied to the current as an excitation variable here.

It is known from DE 10 2013 218 077 A and DE 10 2013 218 081 A1 that impedance spectroscopy can be used to ascertain a state of battery modules in a battery system. A measuring circuit is integrated into each battery module of the battery system to generate and evaluate the measurement currents and measurement voltages, on the basis of which the impedance spectroscopy is carried out.

The use of lithium-ion battery cells as chemical energy accumulators in the electrical drive train of electric and hybrid motor vehicles represents the present prior art in this case. This type of battery cells requires continuous monitoring and regulation to ensure aspects such as performance, robustness, and above all safety over the entire product life cycle. In a conventional battery system, the voltages of all cells and the total current present are typically measured. In addition, temperature sensors are attached at defined points in the system to be able to observe the thermal behavior of the battery. As an alternative to lithium-ion cells, fuel cells can also be used in electric and hybrid vehicles. The fuel cell itself is also an electrochemical system that has to be monitored. A traction battery is also required in these fuel-cell vehicles so that the current generated by the fuel cell can be temporarily stored. Both of these mentioned types of energy storage and energy conversion (battery cell/fuel cell) are referred to hereinafter as a cell, since the patent concept is applicable to various types of storage.

The monitoring of the cells by sensors is to be improved in that novel types of cell characterization are introduced into the automobile. A more accurate state estimation has a positive effect, inter alia, on the driving operation and can enable an improved range, for example.

SUMMARY

The invention is based on the object of expanding the monitoring of at least one cell element in an electric energy supply system with little circuitry expenditure.

An electric energy supply system having at least one cell element is provided by the invention. One or more galvanic cells are contained in each cell element. A battery cell or a fuel cell can be provided as the cell element in the manner mentioned, so that a battery system or a fuel-cell system results accordingly as the energy supply system. The energy supply system furthermore comprises a measuring circuit, which is configured, of two predetermined electric variables, in particular an electric current and an electric voltage, to apply one of these electric variables as an electric excitation variable in the at least one cell element and during this to detect the other electric variable as an electric measured variable at the at least one cell element. For example, an excitation current can be applied and a measurement voltage can thus be detected or an excitation voltage can be applied and a measurement current can be detected. By applying one of the two electric variables, the time curve of an amount and/or a direction of this electric variable is defined or specified by the measuring circuit. The resulting measured variable then results in reaction of the at least one cell element to the excitation variable. The reaction is dependent here on an internal state of the at least one cell element, i.e., on at least one parameter of the at least one cell element. The measuring circuit is accordingly configured to ascertain the at least one parameter of the at least one cell element on the basis of the applied or known excitation variable and the resulting or detected measured variable by means of electrochemical impedance spectroscopy. An electrochemical impedance spectroscopy is therefore implemented in the measuring circuit, which receives as input variables a signal curve of the excitation variable and the measured variable or at least the signal curve of the measured variable and, for example, computes the at least one parameter or derives it by means of a model on the basis of the known excitation variable and the then known measured variable. Said measuring circuit can be based, for example, on an analog circuit and/or on a microcontroller.

Proceeding from this constellation, which is known per se from the prior art, the invention now provides an expansion of the monitoring capability of the energy supply system with little expenditure, in that the energy supply system comprises an electrochemical gas sensor. Such an electrochemical gas sensor can also be based, for example, on an electrochemical cell, for example, on a Clark electrode or on a fuel cell or on a redox measuring element. Measuring methods which are also provided for the at least one cell element can now be used for the operation of the electrochemical gas sensor due to its electrochemical functional principle. For this reason, a separate measuring circuit is thus not necessary for the operation of the gas sensor. Rather, it is provided according to the invention that the gas sensor is connected to the above-described measuring circuit (for the at least one cell element) via a toggle switch, wherein the toggle switch is configured to switch over in dependence on a switching signal of a control circuit between a first switching state, in which the measuring circuit is electrically connected to the at least one cell element, and a second switching state, in which the measuring circuit is electrically connected to the gas sensor. In particular, it is provided that the measuring circuit is connected in the first switching state only to the at least one cell element and not to the gas sensor and is electrically connected in the second switching state only to the gas sensor and not to the at least one cell element. By means of the switching signal of the control circuit, the measuring circuit can thus alternately be electrically coupled or connected either to the gas sensor or to the at least one cell element. The measuring circuit can thus be used both to ascertain the at least one parameter of the at least one cell element and also to operate the gas sensor. For the latter, the measuring circuit is configured, in the second switching state of the toggle switch, to apply one of the mentioned electric variables (for example, current or voltage) as the excitation variable in the gas sensor and to detect the other electric variable as the measured variable at the gas sensor and then, on the basis of the applied excitation variable and the detected measured variable, to ascertain a gas content or a gas concentration of a predetermined gas in the surroundings of the gas sensor by means of a predetermined calculation rule. The gas concentration can thus be ascertained for the energy supply system by means of the same measuring circuit which also ascertains the at least one parameter of the at least one cell element.

The advantage results due to the invention that the monitoring of the gas concentration can be implemented or provided on the basis of a measuring circuit, which is provided in any case for a diagnosis of the at least one cell element (ascertaining the at least one parameter). Only an electrochemical sensor and the toggle switch are provided or added. This is an expansion of the measuring options for the energy supply system by a measurement of a gas concentration which is implementable with little circuitry expenditure.

The invention also comprises embodiments, due to which additional advantages result.

For the sake of clarity, the invention is described here in conjunction with a single gas sensor. However, multiple gas sensors can also be provided for the energy supply system, each of which can be coupled via a respective or separate toggle switch to a measuring circuit of the energy supply system. Multiple measuring circuits can thus be provided in the energy supply system.

In one embodiment, the measuring circuit is configured to set a time curve of the excitation variable in dependence on the selected switching state of the toggle switch. This dependency can be provided indirectly, in that said control circuit switches the toggle switch into one of the two switching states and signals the measuring circuit which switching state was actuated or set. By varying or changing the time curve depending on whether the gas sensor or the at least one cell element is excited using the excitation element, the advantage results that a time curve of the excitation variable adapted for determining the gas concentration, on the one hand, and for determining the at least one parameter, on the other hand, can be provided. For example, a sinusoidal oscillation at a predetermined frequency or multiple sinusoidal oscillations of different frequencies (in succession or superimposed) and/or a chirp signal and/or a jump function and/or a pulse sequence can be provided as the time curve. A signal having constant amplitude or constant level (DC voltage or direct current) can also be provided as the time curve of the excitation variable.

In one embodiment, a frequency response analyzer is integrated into the measuring circuit. This can be implemented, for example, on the basis of program instructions for a microcontroller and/or on the basis of an analog or digital filter bank. The advantage results that a frequency response, in particular a frequency dependence of the impedance of the gas sensor and/or the at least one cell element, can be ascertained from the excitation variable and the measured variable. The at least one parameter of the at least one cell element and/or the gas concentration can be ascertained by comparison to reference frequency responses which are specified or measured at an earlier point in time.

In one embodiment, said calculation rule comprises, on the one hand, an impedance measurement of at least one impedance value at the gas sensor and/or a current measurement of at least one current value of an electric current and/or the voltage measurement of an electric voltage value and, on the other hand, an association of the at least one impedance value and/or current value and/or voltage value with a value of the gas concentration. An impedance value can be ascertained, for example, in that at a given frequency of the excitation variable, an associated measured value of the measured variable is ascertained, wherein current and voltage are used as the electric variables, so that a current value and a voltage value are comprised. The impedance value is then ascertained as the quotient of voltage value divided by current value. The association of impedance value/current value/voltage value with gas concentration can then be carried out, for example, by means of a conversion formula and/or a lookup table and/or a characteristic curve of the gas sensor, which is thus part of said calculation rule. This can also be carried out for multiple different frequencies to obtain multiple impedance values. A frequency response of the impedance comprising multiple frequencies can then be ascertained, wherein the impedance values represent individual values of the frequency response. The association can then be produced, for example, by comparing different reference frequency responses to the measured frequency response. Each reference frequency response is then associated with one value of the gas concentration and the reference frequency response having the smallest difference from the measured frequency response is then selected to ascertain the value of the gas concentration.

In one embodiment, said control unit is configured to generate the switching signal according to a predetermined switchover strategy. In other words, it is schematically defined when the toggle switch is to electrically connect the measuring circuit to the gas sensor and when to the at least one cell element. The switchover strategy in this case comprises that in a normal mode, in which the at least one cell element absorbs and/or emits electric energy for a system-external device connected to the energy supply system (i.e., acts as an energy accumulator or energy source), the measuring circuit is kept connected to the gas sensor and for a diagnostic mode, in which the gas sensor is electrically separated from the measuring circuit, the measuring circuit is kept connected to the at least one cell element. Therefore, the gas sensor is thus operated by the measuring circuit for the normal mode and thus in particular for the majority of the time. In the normal mode, a continuous or permanent or repeated measurement of the value of the gas concentration is thus carried out and therefore the presence of a predetermined gas, to which the gas sensor is sensitive, is detected during the normal mode. If necessary, it is possible to change to the diagnostic mode, if, for example, a state of the at least one cell element, i.e., the at least one parameter, is to be checked or measured and/or a model of the at least one cell element is to be updated. For the diagnostic mode, it can be provided that the at least one cell element is excluded from the normal mode (i.e., is not coupled or electrically connected to the system-external device).

In one embodiment, the at least one cell element is a battery cell in each case. In other words, the energy supply system is a battery system. Alternatively thereto, in one embodiment the at least one cell element is a fuel cell in each case. In other words, the energy supply system is then a fuel-cell system. For these two cell types (battery cell and fuel cell), it has proven to be particularly advantageous to use an electrochemical gas sensor, since it can be operated using the same measuring circuit as a battery cell and a fuel cell as well.

In one embodiment, the gas sensor is designed to detect water vapor. In this way, a leak of a housing of the energy supply system, for example, the external housing, which delimits the energy supply system to the outside, or a module housing of a cell module, in which some of the cell elements of the energy supply system are arranged, or a cell housing of an individual cell element can be monitored for leaks. Additionally or alternatively thereto, a gas sensor can be provided for a gas generated by cell chemistry of the at least one first cell element, in order to detect a leak and/or an aging state of the at least one cell element.

In one embodiment, said toggle switch is designed to switch over multiple wires or connecting lines of the measuring circuit and comprises at least one semiconductor switch in each case for electrical switching over for each connecting line. A semiconductor switch can be implemented, for example, on the basis of a transistor. A MOSFET (Metal Oxide Semiconductor Field Effect Transistor) is preferably provided as the transistor. A semiconductor switch for switching over has the advantage that in contrast to a mechanical switch, contact resistances on movable mechanical switch parts are avoided. The toggle switch is preferably configured to switch over four connecting lines and the measuring circuit is configured to carry out a four-conductor measurement or four-point measurement. This enables particularly accurate detection of the measured variable. With a gas sensor, a version having three or four conductors can be used to work with a single or multiple reference electrodes. In contrast, in the impedance measurement of battery cells (full cells, commercially without reference electrode), the four-conductor measurement advantageously serves to minimize errors.

Several possible embodiments relating to the arrangement relating to the gas sensor are described hereinafter.

In one embodiment, the gas sensor is integrated into an individual cell element. In other words, the gas sensor can be arranged in a cell housing or on the cell housing. Each cell element can thus be monitored individually by means of a gas sensor. Of course, it can be provided in this case that a gas sensor is arranged in the energy supply system in every cell element or on every cell element. A cell chemistry of the cell element can be monitored by arranging the gas sensor in the cell element. By arranging it on the cell housing of the cell element, an escape of the cell chemistry from the cell element or a leak of the cell housing can be recognized by measuring the gas content.

In one embodiment, the gas sensor is arranged together with multiple cell elements in a module housing. Multiple such module housings, each having multiple cell elements arranged thereon, can be provided in the energy supply system. A separate gas sensor can then be provided accordingly in each cell module. By arranging the gas sensor in a cell module, the advantage results that multiple cell elements can be monitored with respect to a leak using a separate gas sensor. In the case of a leaky cell element, however, not all cell elements of the energy supply system need to be examined or replaced, but rather an association module by module is possible on the basis of the gas sensor in the cell module.

In one embodiment, the gas sensor is arranged in an external housing of the energy supply system. The external housing means the housing delimiting the energy supply system to the outside in this case, i.e., the entire housing. By arranging the gas sensor in the external housing, a leaky cell element in the energy supply system can be recognized using a single gas sensor. Vice versa, a leak of the external housing can be recognized if, for example, water vapor penetrates into the external housing.

In one embodiment, the gas sensor is arranged externally on the external housing of the energy supply system. In this way, gas escaping from the external housing can be detected, in that the gas sensor reacts sensitively to a gas which can only occur in the external housing due to a leaky cell element.

In one embodiment, the gas sensor is arranged outside the external housing of the energy supply system in another energy supply system. In other words, the energy supply system monitors another energy supply system by means of its gas sensor. Thus, for example, the energy supply system can be designed as a battery system, which monitors its own battery cells by means of electrochemical impedance spectroscopy and also uses its measuring circuit for impedance spectroscopy to operate a gas sensor which is arranged in another energy supply system, for example, a fuel-cell system. In this way, a separate measuring circuit does not have to be provided in the fuel-cell system.

The invention also provides a motor vehicle. The motor vehicle according to the invention comprises an embodiment of the energy supply system according to the invention. The motor vehicle according to the invention is preferably designed as an automobile, in particular as a passenger vehicle or truck, or as a passenger bus or motorcycle.

BRIEF DESCRIPTION OF THE DRAWINGS

The disclosure also comprises the combinations of the features of the described embodiments.

Exemplary embodiments of the invention are described hereafter. In the figures.

DETAILED DESCRIPTION

The exemplary embodiments explained hereinafter are preferred embodiments of the invention. In the exemplary embodiments, the described components of the embodiments each represent individual features of the invention to be considered independently of one another, which each also refine the invention independently of one another. Therefore, the disclosure is also intended to comprise combinations of the features of the embodiments other than those shown. Furthermore, the described embodiments can also be supplemented by further features of the invention that have already been described.

In the figures, the identical reference signs each identify functionally-identical elements.

Figure 1:
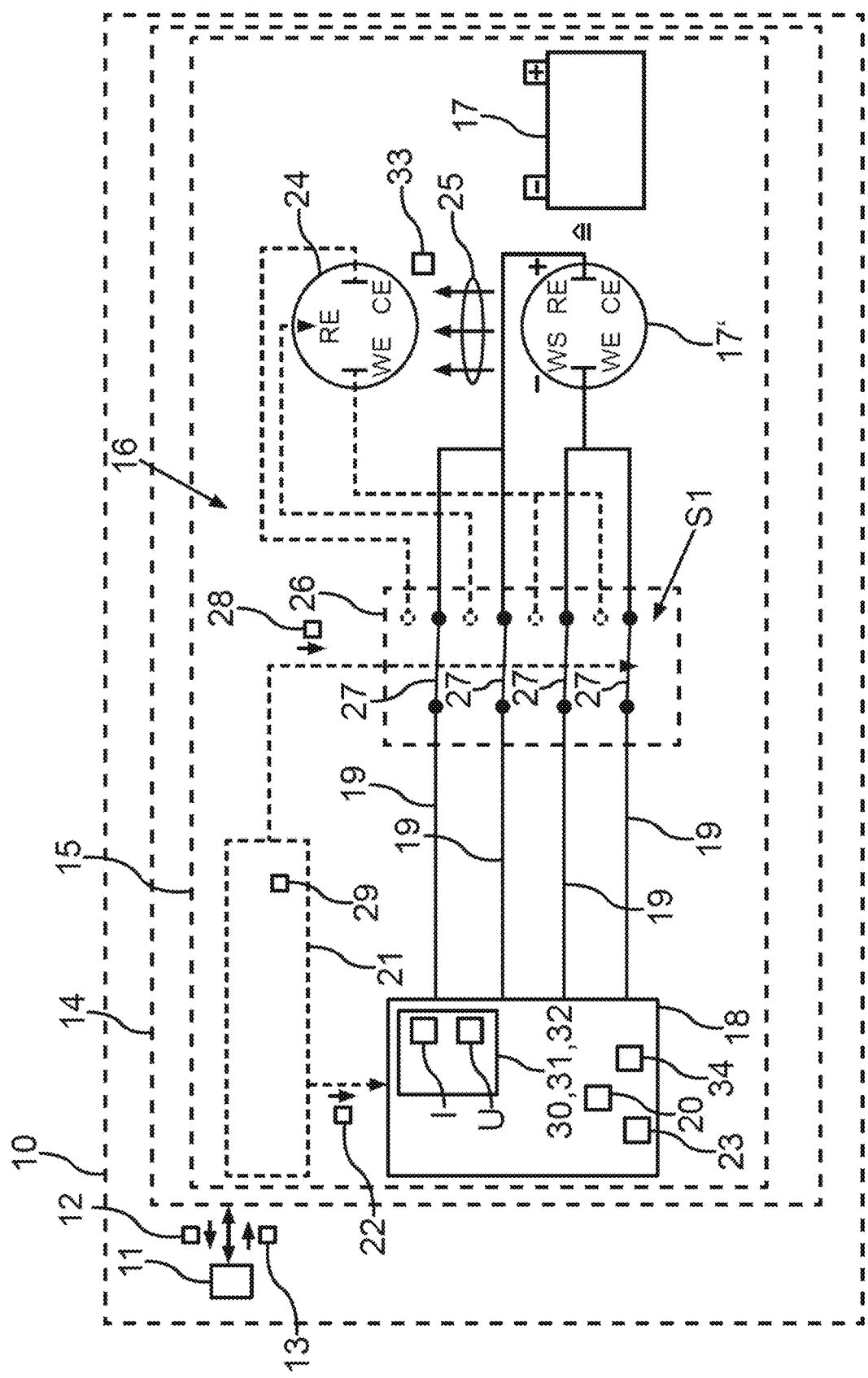
FIG. 1 shows a schematic illustration of one embodiment of the motor vehicle according to the invention having an energy supply system, in which a toggle switch is switched into a first switching state.
Figure 2:
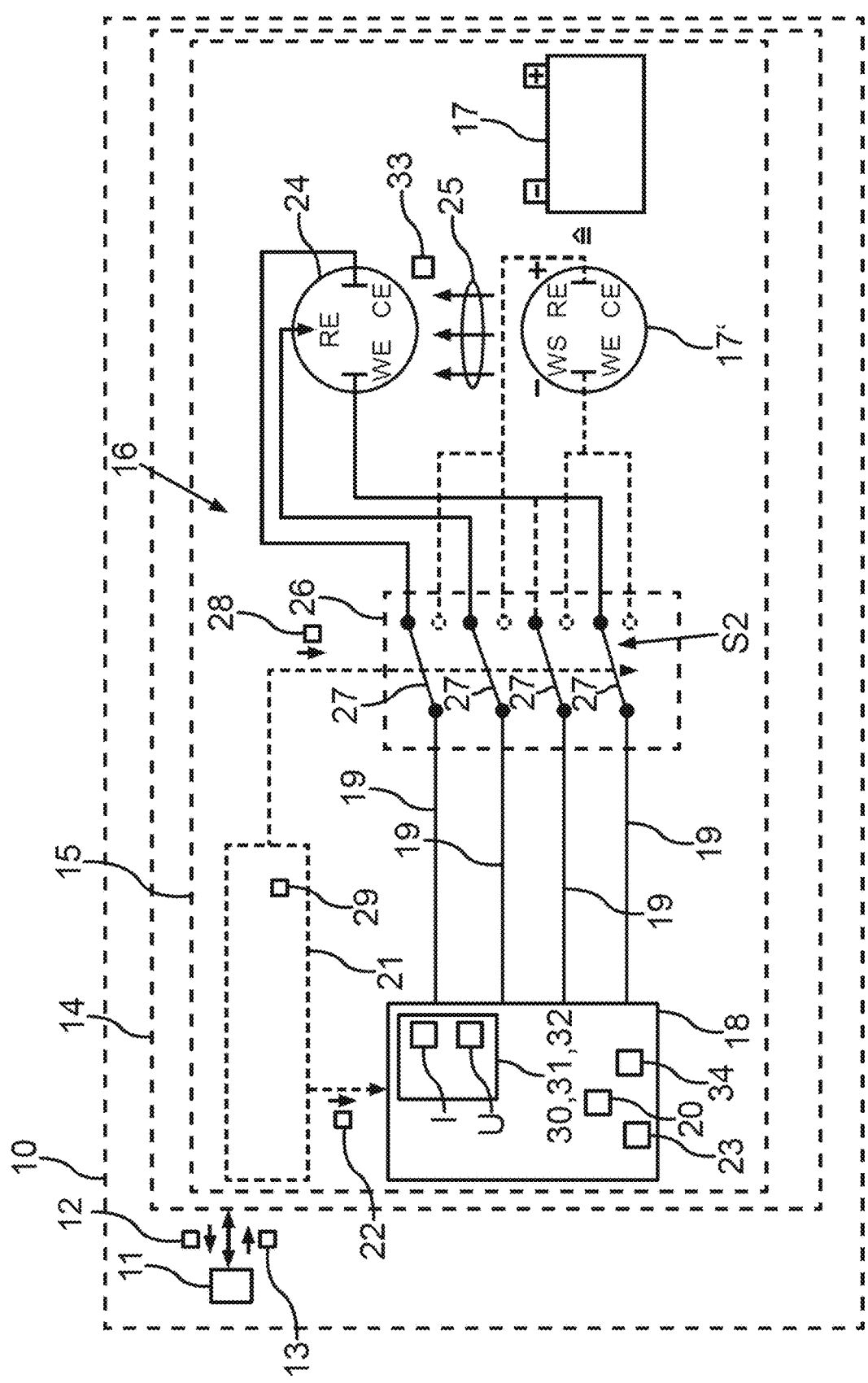
FIG. 2 shows a schematic illustration of the motor vehicle from FIG. 1, wherein the toggle switch is switched into a second switching state.

FIG. 1 and FIG. 2 show a motor vehicle 10, which can be an automobile, in particular a passenger vehicle or truck, or a passenger bus. A device 11, which has to be supplied with electric energy 12 for operation, can be provided in the motor vehicle 10. In addition, it can be provided that the device 11 generates recuperation energy 13 as electric energy that has to be temporarily stored. The device 11 can represent, for example, an electric drive motor of the motor vehicle 10. To generate and/or store the electric energy 12, an energy supply system 14 can be provided in the motor vehicle 10, which can be designed or implemented as a battery system or as a fuel cell system. In the case of a battery system, the energy supply system 14 can also absorb and temporarily store the recuperation energy 13.

Structural units 15, which can contain one or more cell elements 16, can be provided in the energy supply system 14. A structural unit 15 can comprise all cell elements 16, so that the structural unit 15 corresponds to the energy supply system 14, or a structural unit 15 can be a cell module having some of the cell elements 16 of the energy supply system 14 or can correspond to an individual cell element 16. In the following, it is assumed that an individual cell element 16 is shown as the structural unit 15. One galvanic cell 17 or multiple galvanic cells 17, which can function as a battery cell or as a fuel cell, can be arranged in the cell element 16. An equivalent circuit diagram 17' is shown for the galvanic cell 17.

A measuring circuit 18 can be provided for monitoring or diagnosis of the cell 17, in order to carry out electrochemical impedance spectroscopy EIS for the cell element 16. For this purpose, multiple connecting lines 19 of the measuring circuit 18 can be connected to the galvanic cell 17, wherein one connection is shown symbolically by the equivalent circuit diagram 17' in FIG. 1. One connecting line can respectively be provided for a counter electrode CE, a reference electrode RE, a working sense line WS, and working electrode WE. The measuring circuit 18 can be implemented, for example, as an integrated circuit (IC) and can contain, for example, a frequency response analyzer 20. To carry out the diagnosis, a control circuit 21 can output a diagnostic signal 22 to the measuring circuit 18, whereupon the measuring circuit 18 ascertains at least one parameter 23 for the interconnected galvanic cell 17 by means of the impedance spectroscopy EIS, in order to hereby describe a corresponding model variable of the equivalent circuit diagram 17, for example, an internal resistance and/or a complex impedance. A corresponding measurement setup can be taken from the prior art.

The control circuit 21 can be implemented, for example, on the basis of a microcontroller and/or an analog circuit and/or a microprocessor.

A gas sensor 24 can additionally be provided or arranged in the structural unit 15, i.e., in particular in the cell element 16, which sensor can detect, for example, a gas development 25 of the galvanic cell 17, thus is sensitive to corresponding gas, as can occur in the case of outgassing or gas evolution 25 in the galvanic cell 17. A person skilled in the art can infer which gas is to be sensed in this case on the basis of the cell chemistry used of the electrochemical cell 17.

The gas sensor 24 is an electrochemical gas sensor, i.e., a measuring circuit is required for its operation, as can be simulated or provided by the measuring circuit 18.

In order to also use the measuring circuit 18 for the gas sensor 24, the measuring circuit 18 is electrically interconnected to the galvanic cell 17 and the gas sensor 24 via a toggle switch 26. The toggle switch 26 can provide a switching element for each of the connecting lines 19, for example, a semiconductor switch 27, in particular a MOSFET, by which an electrical connection of the respective connecting line 19 is switched over between a first switching state S1, as shown in FIG. 1, and a switching state S2, as shown in FIG. 2.

The switching over can be effectuated by the control circuit 21 by a switching signal 28. By means of the switching signal 28, for example, an electric voltage at a respective gate of the semiconductor switch 27 can be set or specified.

For the switchover between the first switching state S1 and the second switching state S2, the control circuit 21 can provide a switchover strategy 29, which can consist, for example, of the gas sensor 24 being operated in the normal mode during the energy exchange of the energy 12 and possibly the recuperation energy 13 and the cell element 17 being involved in this case, and the first switching state S1 only being set for a diagnostic operation.

An electric current can be conducted via two of the connecting lines 19, while an electric voltage U can be measured or output via the remaining two connecting lines. The electric current I and the electric voltage U represent two electric variables 30, of which one can be generated by the measuring circuit 18 and thus represents an excitation variable 31 and the remaining electric variable 30 can then be detected or measured as a measured variable 32.

In the second switching state S2, the electric voltage U, for example, can be applied to the gas sensor 24 as the excitation variable 31 and a resulting electric current I can be measured or detected as the measured variable 32. If the electric voltage U is known and the electric current I is measured, a gas concentration 33 can be inferred, which can result due to the gas evolution 25, for example. A calculation rule 34 can be provided in the measuring circuit 18 or the control circuit 21 to ascertain the gas concentration 33 from the excitation variable 31 and the measured variable 32.

The use of at least one gas sensor 24 in the energy supply system 14 is therefore cost-effective to develop and provide, and also the installation of the energy supply system 14 is simple due to the few additional elements (gas sensor and toggle switch). The measuring circuit 18 can be used for different purposes and a synergy effect can thus be achieved.

The gas sensor 24 is an advantageous expansion here, because various gases can arise in the product lifecycle of battery cells due to reactions of the materials used, which result from correct operation, abnormal use, and also from malfunctions of the cell. With fuel cells, on the other hand, gases are continuously supplied for operation (e.g. hydrogen & oxygen) to convert the chemical reaction energy into electric energy. A first innovative option for monitoring both cell types is therefore to use electrochemical gas sensors. These gas sensors have the structure of an electrochemical cell with electrodes that are in contact with an electrolyte. The electrodes of an electrochemical gas sensor have to be kept at a defined potential in operation, whereby a current to be measured results, which reflects the gas concentration. The electronics required for this correspond to the hardware that is used for electrochemical impedance spectroscopy (EIS) to inspect battery cells and fuel cells. In this impedance measurement, the electrical excitation is used to ascertain the internal structure of the electrochemical system, which represents a voltage source.

Using the same measuring circuit 18, on the one hand, the gas sensor 24 can be operated, and also the impedance of a battery cell or a fuel cell can be measured. The combined use of an EIS measuring circuit both for gas sensors and for cell measurement results not only in reduced costs, but rather also a smaller installation space requirement. This possibility for the implementation makes incorporation of the mentioned technologies in a future chemical energy storage system or fuel cell system significantly more attractive.

The technical implementation can follow the following basic principle:

EIS for impedance measurement: battery cells and fuel cells are not ideal voltage sources, but rather electrochemical systems that can provide limited energy and power due to internal resistances and/or dynamic processes. The resistance (=impedance) may be calculated from current and voltage values, wherein either the current is specified and the voltage is measured or the current is detected with defined voltage. This targeted excitation may be implemented by an EIS measuring device (measuring circuit 18). A maximum of four electrodes are generally used in the electrochemical analysis of the various systems: —counter electrode (CE)-reference electrode (RE)-working electrode (WE)-working sense (WS). Using the EIS, statements about the internal composition can be made without a direct view into the cell interior. As can be seen at the bottom right in FIG. 1, only the two poles (positive and negative) can be externally electrically contacted. Nonetheless, four lines are connected to the cell to enable the setup of a four-conductor measurement from an electrotechnical perspective.

EIS for gas sensors: An electrochemical gas sensor 24 usually has three poles and measures the concentration of the target gas in that an oxidation or reduction of this gas at an electrode produces a measurable current. The current is proportional to the gas concentration if the potential is regulated by corresponding electronics.

FIG. 2 shows an example of the claimed gas sensor 24 having three poles. The sensor is excited by the EIS measuring device and thus reflects the concentration of the gas present on the basis of the measured current. As can be seen from the two figures, the EIS measuring device can be used both for characterizing the (electric) properties of a cell on the basis of the impedance and also for gas measurement. In the case of the latter, the state of the cell is back calculated from the knowledge of the occurring gas formation or a possible problem in the system is detected.

Switchover strategy and additional remarks: The use of the mentioned methods using an EIS measuring device requires switching over between the excitation of the gas sensor and excitation of the cells by switches. The switch position, specified by an associated control unit, defines the present measuring method in that the four electrode lines are conductively connected to the corresponding apparatus. In one possible application scenario, the gas concentration of the battery cell or fuel cell is continuously monitored (FIG. 2) and interrupted at defined intervals to carry out an impedance measurement (FIG. 1). The illustrations shown represent only one possible configuration of the concept. As already mentioned at the beginning, fuel-cell vehicles, for example, also have a traction battery. Therefore, in such a system, the impedance of the battery cells, the impedance of the fuel cell, and the gas concentration present can be analyzed using an EIS measuring device. The application is thus expandable to arbitrary combinations of electrochemical systems, wherein the switches in the system comprise the corresponding structure and a reasonable switching strategy has to be selected.

Overall, the examples show how the invention enables EIS to be used as a combination for cell measurement and gas sensors in a battery system.

The invention claimed is:

1. An electric energy supply system comprising:
   at least one cell element, which contains at least one galvanic cell,
   a measuring circuit, which is configured to apply a first of two predetermined electric variables in the at least one cell element as an electric excitation variable and to detect a second of the two predetermined electric variables as an electric measured variable at the at least one cell element and, based on the applied excitation variable and the detected measured variable, to ascertain at least one parameter of the at least one cell element by electrochemical impedance spectroscopy, and
   an electrochemical gas sensor, which is connected to the measuring circuit via a toggle switch,
   wherein the toggle switch is configured to switch over based on a switching signal of a control circuit between a first switching state, in which the measuring circuit is electrically connected to the at least one cell element, and a second switching state, in which the measuring circuit is electrically connected to the gas sensor,
   wherein the measuring circuit is configured, in the second switching state, to apply the excitation variable in the gas sensor, to detect as the measured variable at the gas sensor, and to ascertain a gas concentration in the surroundings of the gas sensor using a predetermined calculation rule, and
   wherein the predetermined calculation rule associates the applied excitation variable and the detected measured variable with the gas concentration via at least one of: a conversion formula, a lookup table, and/or a characteristic curve.

2. The energy supply system as claimed in claim 1, wherein the control circuit is configured to set a time curve of the excitation variable in the measuring circuit based on the selected switching state of the toggle switch.

3. The energy supply system as claimed in claim 1, wherein the measuring circuit further comprises a frequency response analyzer.

4. The energy supply system as claimed in claim 1, wherein the calculation rule comprises an association of at least one measured impedance value, at least one measured current value, and/or at least one measured voltage value with a value of the gas concentration.

5. The energy supply system as claimed in claim 1, wherein the control circuit is configured to generate the switching signal according to a predetermined switchover strategy, the switchover strategy comprising:
   a normal mode, in which the at least one cell element absorbs and/or emits electric energy for a connected system-external device, keeping the gas sensor connected to the measuring circuit, and
   a diagnostic mode, in which the gas sensor is electrically disconnected from the measuring circuit, keeping the at least one cell element connected to the measuring circuit.

6. The energy supply system as claimed in claim 1, wherein the at least one cell element is a battery cell or a fuel cell.

7. The energy supply system as claimed in claim 1, wherein the gas sensor is designed to detect water vapor and/or a gas generated by a cell chemistry of the at least one cell element.

8. The energy supply system as claimed in claim 1 wherein the toggle switch comprises at least one semiconductor switch for each of multiple connecting lines of the measuring circuit for electrical switching.

9. The energy supply system as claimed in claim 1, wherein the gas sensor is arranged:
   in or on a single cell element,
   together with multiple cell elements in a module housing of one of multiple cell modules,
   in an external housing of the energy supply system,
   externally on the external housing of the energy supply system, or
   outside the external housing of the energy supply system in another energy supply system.

10. The energy supply system as claimed in claim 2, wherein the measuring circuit further comprises a frequency response analyzer.

11. The energy supply system as claimed in claim 2, wherein the calculation rule comprises an association of at least one measured impedance value, at least one measured current value, and/or at least one measured voltage value with a value of the gas concentration.

12. The energy supply system as claimed in claim 3, wherein the calculation rule comprises an association of at least one measured impedance value, at least one measured current value, and/or at least one measured voltage value with a value of the gas concentration.

13. The energy supply system as claimed in claim 2, wherein the control circuit is configured to generate the switching signal according to a predetermined switchover strategy, the switchover strategy comprising:
- a normal mode, in which the at least one cell element absorbs and/or emits electric energy for a connected system-external device, keeping the gas sensor connected to the measuring circuit, and
- a diagnostic mode, in which the gas sensor is electrically disconnected from the measuring circuit, keeping the at least one cell element connected to the measuring circuit.

14. The energy supply system as claimed in claim 3, wherein the control circuit is configured to generate the switching signal according to a predetermined switchover strategy, the switchover strategy comprising:
- a normal mode, in which the at least one cell element absorbs and/or emits electric energy for a connected system-external device, keeping the gas sensor connected to the measuring circuit, and
- a diagnostic mode, in which the gas sensor is electrically disconnected from the measuring circuit, keeping the at least one cell element connected to the measuring circuit.

15. The energy supply system as claimed in claim 4, wherein the control circuit is configured to generate the switching signal according to a predetermined switchover strategy, the switchover strategy comprising:
- a normal mode, in which the at least one cell element absorbs and/or emits electric energy for a connected system-external device, keeping the gas sensor connected to the measuring circuit, and
- a diagnostic mode, in which the gas sensor is electrically disconnected from the measuring circuit, keeping the at least one cell element connected to the measuring circuit.

16. The energy supply system as claimed in claim 2, wherein the at least one cell element is a battery cell or a fuel cell.

17. The energy supply system as claimed in claim 3, wherein the at least one cell element is a battery cell or a fuel cell.

18. The energy supply system as claimed in claim 4, wherein the at least one cell element is a battery cell or a fuel cell.

19. The energy supply system as claimed in claim 5, wherein the at least one cell element is a battery cell or a fuel cell.

20. The energy supply system as claimed in claim 2, wherein the gas sensor is designed to detect water vapor and/or a gas generated by a cell chemistry of the at least one cell element.

* * * * *